United States Patent
Ball et al.

(10) Patent No.: US 9,257,954 B2
(45) Date of Patent: Feb. 9, 2016

(54) AUTOMATIC AUDIO HARMONIZATION BASED ON PITCH DISTRIBUTIONS

(71) Applicant: Microsoft Technology Licensing, LLC, Redmond, WA (US)

(72) Inventors: Steven J. Ball, Seattle, WA (US); Jorge Gabuardi Gonzalez, Seattle, WA (US); Tyler Brewer, Iowa City, IA (US); Mitchell K. Rundle, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 195 days.

(21) Appl. No.: 14/032,154

(22) Filed: Sep. 19, 2013

(65) Prior Publication Data

US 2015/0078583 A1    Mar. 19, 2015

(51) Int. Cl.
*H03G 5/00* (2006.01)
*H03G 5/16* (2006.01)
*G10H 7/00* (2006.01)
*G10H 1/00* (2006.01)

(52) U.S. Cl.
CPC ............ *H03G 5/16* (2013.01); *G10H 1/0025* (2013.01); *G10H 7/00* (2013.01); *G10H 2210/066* (2013.01); *G10H 2210/081* (2013.01); *G10H 2210/125* (2013.01); *G10H 2210/325* (2013.01); *G10H 2210/555* (2013.01); *G10H 2250/641* (2013.01)

(58) Field of Classification Search
CPC .......... H04R 3/04; H04S 7/307; H03G 5/005; H03G 5/025; H03G 5/165
See application file for complete search history.

(56) References Cited

U.S. PATENT DOCUMENTS

| | | | |
|---|---|---|---|
| 5,231,671 | A | 7/1993 | Gibson et al. |
| 6,066,792 | A | 5/2000 | Sone |
| 6,103,964 | A | 8/2000 | Kay |
| 6,124,543 | A | 9/2000 | Aoki |
| 7,220,911 | B2 | 5/2007 | Basu |
| 7,667,126 | B2 | 2/2010 | Shi |
| 7,842,874 | B2 | 11/2010 | Jehan |
| 8,168,877 | B1 | 5/2012 | Rutledge et al. |

(Continued)

FOREIGN PATENT DOCUMENTS

| | | |
|---|---|---|
| EP | 1959429 | 8/2008 |
| WO | WO-2009022084 | 2/2009 |
| WO | WO-2009032794 | 3/2009 |

OTHER PUBLICATIONS

"International Search Report and Written Opinion", Application No. PCT/US2014/055972, Feb. 5, 2015, 11 pages.

(Continued)

*Primary Examiner* — Simon Sing
(74) *Attorney, Agent, or Firm* — Jeremy Snodgrass; Judy Yee; Micky Minhas

(57) ABSTRACT

Two audio samples and/or sets of audio samples are identified. The pitch distributions of the audio samples and/or sets of audio samples are identified, the pitch distribution of an audio sample or set of audio samples referring to how much of each of multiple pitches of notes is present in the audio sample or set of audio samples. Based on the pitch distributions of the audio samples and/or sets of audio samples, at least one pitch of one of the audio sample and/or set of audio samples can be automatically adjusted (but need not be, depending on the pitch distributions) to increase harmonic coherence of the audio samples and/or sets of audio samples.

20 Claims, 8 Drawing Sheets

(56) References Cited

U.S. PATENT DOCUMENTS

| | | | |
|---|---|---|---|
| 8,338,686 B2 | 12/2012 | Mann et al. | |
| 8,426,715 B2 | 4/2013 | Bregar et al. | |
| 2005/0240396 A1* | 10/2005 | Childs et al. | 704/207 |
| 2007/0107585 A1* | 5/2007 | Leahy | G06Q 50/10 84/616 |
| 2007/0137463 A1 | 6/2007 | Lumsden | |
| 2007/0193435 A1 | 8/2007 | Hardesty et al. | |
| 2007/0213981 A1* | 9/2007 | Meyerhoff et al. | 704/243 |
| 2007/0291958 A1 | 12/2007 | Jehan | |
| 2008/0188967 A1 | 8/2008 | Taub et al. | |
| 2008/0190271 A1 | 8/2008 | Taub et al. | |
| 2008/0215340 A1* | 9/2008 | Su et al. | 704/500 |
| 2008/0300702 A1* | 12/2008 | Gomez et al. | 700/94 |
| 2009/0019995 A1 | 1/2009 | Miyajima | |
| 2009/0214050 A1* | 8/2009 | Sawashi | H04R 3/04 381/73.1 |
| 2009/0299736 A1* | 12/2009 | Sato | G10L 19/04 704/207 |
| 2010/0186579 A1 | 7/2010 | Schnitman | |
| 2010/0199833 A1 | 8/2010 | McNaboe | |
| 2010/0293455 A1 | 11/2010 | Bloch | |
| 2010/0305732 A1 | 12/2010 | Serletic | |
| 2011/0268279 A1* | 11/2011 | Ishikawa | G10L 19/008 381/22 |
| 2012/0118127 A1 | 5/2012 | Miyajima | |
| 2012/0132056 A1 | 5/2012 | Wang | |
| 2012/0312145 A1 | 12/2012 | Kellett et al. | |
| 2015/0081064 A1 | 3/2015 | Ball et al. | |
| 2015/0081065 A1 | 3/2015 | Ball et al. | |
| 2015/0081613 A1 | 3/2015 | Ball et al. | |

OTHER PUBLICATIONS

Janer, et al., "Sound Object Classification for Symbolic Audio Mosaicing: A Proof-of-Concept", Proceedings of the SMC 2009—6th Sound and Music Computing Conference, Porto—Portugal, Jul. 2009, 6 pages.

Schwarz, "The Caterpillar System for Data-Driven Concatenative Sound Synthesis", Proc. of the 6th Int. Conference on Digital Audio Effects (DAFx-03), London, UK, Sep. 2003, 6 pages.

"Beyond Beatmatching: How to Use Harmonic Mixing (How to DJ)", Retrieved from the Internet: <<https://web.archive.org/web/20120712011901/http://www.mixedinky.com/Book/How-To-Use-Harmonic-Mixing>> on Aug. 12, 2014, 4 pages.

"DJ Demonstration Pitch bend on pioneer CDJ-1000", retrieved from the Internet: <<https://www.youtube.com/watch?v=7d9BlaBD5XE>> on Aug. 12, 2014, 1 page.

"From Human Jukebox to DJ Artist", Camelot Sound—Retrieved from the Internet: <<https://web.archive.org/web/20121117184120/http://www.camelotsound.com/History.aspx spx>> on Aug. 12, 2014, 4 pages.

"How to: Understanding key and tempo in Harmonic Mixing", Discussion in "General DJ Discussion" started by djyakov, Jan. 31, 2007 Retrieved from the Internet: <<http://www.djtechtools.com/2010/03/23/ to-key-or-not-to-key/>> on 081/2/2014, 8 pages.

"International Search Report and Written Opinion", Application No. PCT/US2014/055973, Dec. 4, 2014, 11 pages.

"International Search Report and Written Opinion", Application No. PCT/US2014/055974, Dec. 19, 2014, 11 pages.

"International Search Report and Written Opinion", Application No. PCT/US2014/055971, Dec. 23, 2014, 11 pages.

"MixMeister Studio", Retrieved from the internet at: <<https://web.archive.org/web/20121014190638/http://www.mixmeister.com/products-mmstu7.php>>, Sep. 7, 2013, 2 pages.

"Rapid Evolution—Wikipedia, the free encyclopedia", Retrieved from the Internet: <<http://en.wikipedia.org/w/index/php?title=Rapid_Evolution&oldid=558815293>> on Aug. 12, 2014, 2 pages.

"To Key or Not to Key", DJ Tech Tools—Retrieved from the Internet: <<http://www.djtechtools.com/2010/03/23/to-key-or-not-to-key>> on Aug. 12, 2014, 6 pages.

Six, et al., "A Robust Audio Fingerprinter Based on Pitch Class Histograms Applications for Ethnic Music Archives", Jan. 20, 2012, 7 pages.

"Mixing in Key: When and How to Change Track Key in DJ Software", May 15, 2013, 5 pages.

"Mixed in Key, Harmonizing Music", Retrieved from: <http://djorbit.blogspot.in/2010/06/mixed-in-key-harmonizing-music.html> on Aug. 23, 2013, (Jun. 24, 2010), 2 pages.

"Pitch Shifting and Multi-Voice Harmonizing Plug-In", Retrieved from: <http://www.sonicstate.com/news/2010/05/12/pitch-shifting-and-multi-voice-harmonizing-plug-in/> on Aug. 23, 2013, (May 12, 2010), 3 pages.

"Propellerhead Polar: Old School Harmonizing and Pitch-Shifter Effect Rack Extension for Reason", Retrieved from: <http://rekkerd.org/propellerhead-polar-old-school-harmonizing-and-pitch-shifter-effect-rack-extension-for-reason/> on Aug. 23, 2013, (Jun. 12, 2012), 3 pages.

"VirSyn Intros Harmony Voice Harmonizer + Pitch Shifter", Retrieved from: <http://www.synthtopia.com/content/2012/09/24/virsyn-intros-harmony-voice-harmonizer-pitch-shifter/> on Aug. 23, 2013, (Sep. 24, 2012), 4 pages.

Aeken, Francis V., "Jackson: DJ Software Powered by Musical Metadata", In *Software BVBA*, Retrieved from <http://vanaeken.com/JacksonCameraReady.pdf>,(Aug. 2001), 5 pages.

Cal, "A Complete Guide to Harmonic Mixing—How to Make a DJ Mix or Mashup Like a Professional", Retrieved from: <http://salacioussound.com/2010/10/a-complete-guide-to-harmonic-mixing-%E2%80%93-how-to-make-a-dj-mix-or-mashup-like-a-professional/> on Aug. 27, 2013 (Oct. 10, 2010), 9 pages.

Gill, Chris "DigiTech HarmonyMan Intelligent Pitch Shifter", Retrieved from: <http://www.guitarworld.com/digitech-harmony-man-intelligent-pitch-shifter> on Aug. 23, 2013, (Aug. 4, 2009), 4 pages.

Gonzalez, et al., "Automatic Mixing Tools for Audio and Music Production", Retrieved from <http://c4dm.eecs.qmul.ac.uk/audioengineering/automaticmixing/> on Jul. 16, 2013, 3 pages.

Griffin, et al., "Beat-Sync-Mash-Coder: A Web Application for Real-Time Creation of Beat-Synchronous Music Mashups", In *IEEE International Conference on Acoustics Speech and Signal Processing*, Retrieved from <http://web.cs.swarthmore.edu/~turnbull/Papers/Griffin_BSMC_ICASSP10.pdf>,(Mar. 14, 2010), 4 pages.

Hawkins, Jordan V., "Automating Music Production with Music Information Retrieval", *A Thesis Submitted for Partial Fulfillment of Requirements for Graduation with Research Distinction in the Department of Computer Science and Engineering of the Ohio State University*, Retrieved from <https://kb.osu.edu/dspace/bitstream/handle/1811/54438/Jordan_Hawkins_Senior_Thesis.pdf?sequence=1>,(Mar. 2013), 66 pages.

Jehan, Tristan "Creating Music by Listening", In *PhD Thesis of Massachusetts Institute of Technology*, Retrieved from <http://web.media.mit.edu/~tristan/Papers/PhD_Tristan.pdf>,(Sep. 2005),137 pages.

LaGrange, Mathieu et al., "Adaptive Harmonization and Pitch Correction of Polyphonic Audio Using Spectral Clustering", In *Proceedings of DAFx 2007*, (Sep. 2007), pp. 1-4.

Mims, Christopher "Auto-Mash-up Your Favorite Tracks", Retrieved from <http://www.technologyreview.com/view/419015/auto-mash-up-your-favorite-tracks/>, (May 20, 2010), 3 pages.

Rogerson, Ben "New Mashup Software Matches Songs Automatically", Retrieved from: <http://www.musicrader.com/news/tech/new-mashup-software-matches-songs-automatically-529066> on Aug. 27, 2013, (Feb. 10, 2012), 4 pages.

"Non-Final Office Action", U.S. Appl. No. 14/032,150, Jun. 3, 2015, 7 pages.

"International Preliminary Report on Patentability", Application No. PCT/US2014/055972, Sep. 9, 2015, 6 pages.

"International Preliminary Report on Patentability", Application No. PCT/US2014/055974, Sep. 11, 2015, 6 pages.

"Notice of Allowance", U.S. Appl. No. 14/032,150, Aug. 31, 2015, 4 pages.

"Supplemental Notice of Allowance", U.S. Appl. No. 14/032,150, Sep. 22, 2015, 2 pages.

* cited by examiner

| Sample 2 Shifted One Semitone 402 ||
|---|---|
| Note | Amount Of Pitch Present |
| A | 0.10 |
| A# | 0.09 |
| B | 0.06 |
| C | 0.17 |
| C# | 0.05 |
| D | 0.09 |
| D# | 0.04 |
| E | 0.09 |
| F | 0.13 |
| F# | 0.05 |
| G | 0.09 |
| G# | 0.04 |

| Sample 2 Shifted Two Semitones 404 ||
|---|---|
| Note | Amount Of Pitch Present |
| A | 0.04 |
| A# | 0.10 |
| B | 0.09 |
| C | 0.06 |
| C# | 0.17 |
| D | 0.05 |
| D# | 0.09 |
| E | 0.04 |
| F | 0.09 |
| F# | 0.13 |
| G | 0.05 |
| G# | 0.09 |

Fig. 4

Pitch Shift Correlation

502 →

| Shift Amount | Correlation |
|---|---|
| 0 | 0.0689 |
| +1 | 0.0904 |
| +2 | 0.0762 |
| +3 | 0.0822 |
| +4 | 0.0698 |
| +5 | 0.0537 |
| +6 | 0.0640 |
| +7 | 0.0587 |
| +8 | 0.0825 |
| +9 | 0.0812 |
| +10 | 0.0822 |
| +11 | 0.0945 |

| Pitch Shift | Weight |
|---|---|
| 0 | 1.0 |
| 1 | 1.0 |
| 2 | 1.0 |
| 3 | 0.98 |
| 4 | 0.98 |
| 5 | 0.97 |
| 6 | 0.97 |
| 7 | 0.97 |
| 8 | 0.98 |
| 9 | 0.98 |
| 10 | 1.0 |
| 11 | 1.0 |

Fig. 6

Pitch Shift Combinations 702

| | |
|---|---|
| 0 | 0 |
| +1 | -11 |
| +2 | -10 |
| +3 | -9 |
| +4 | -8 |
| +5 | -7 |
| +6 | -6 |
| +7 | -5 |
| +8 | -4 |
| +9 | -3 |
| +10 | -2 |
| +11 | -1 |

Fig. 7

AUTOMATIC AUDIO HARMONIZATION BASED ON PITCH DISTRIBUTIONS

BACKGROUND

As computing technology has advanced, the uses people have found for computers has expanded. One such use is music, with various software programs allowing for the authoring and playback of music. Although these programs are useful, they are not without their problems. One such problem is that these software programs typically provide a great deal of control over various aspects of the music, allowing the user to independently adjust numerous different aspects of the music. This control, however, requires specialized knowledge on the part of the user regarding how music is composed, which can lead to frustrating user experiences for users without such specialized musical knowledge.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with one or more aspects, a first pitch distribution of first audio and a second pitch distribution of second audio are obtained. The first audio is an audio sample or set of audio samples, and the second audio is an audio sample or set of audio samples. Based on the first pitch distribution and the second pitch distribution, a pitch shift to increase harmonic coherence of the first audio and the second audio is determined The pitch shift is used to increase harmonic coherence of the first audio and the second audio.

BRIEF DESCRIPTION OF THE DRAWINGS

The same numbers are used throughout the drawings to reference like features.

FIG. 4 illustrates example shifted versions of pitch distributions.

FIG. 5 illustrates an example table of pitch shift correlations for two example audio samples.

FIG. 6 illustrates an example table of pitch shifts and corresponding weights in accordance with one or more embodiments.

FIG. 7 illustrates an example table of pitch shift combinations, showing the relative positive and negative shift combinations.

DETAILED DESCRIPTION

Automatic audio harmonization based on pitch distributions is discussed herein. Two audio samples and/or sets of audio samples are identified. The pitch distributions of the audio samples and/or sets of audio samples are identified, the pitch distribution of an audio sample or set of audio samples referring to how much of each of multiple pitches of notes is present in the audio sample or set of audio samples. Based on the pitch distributions of the audio samples and/or sets of audio samples, at least one pitch of one of the audio sample and/or set of audio samples is automatically adjusted to increase harmonic coherence of the audio samples and/or sets of audio samples. The user is thus able to have at least one of the two audio samples and/or sets of audio samples automatically adjusted so that the two audio samples and/or sets of audio samples sound good together harmonically.

Figure 1:
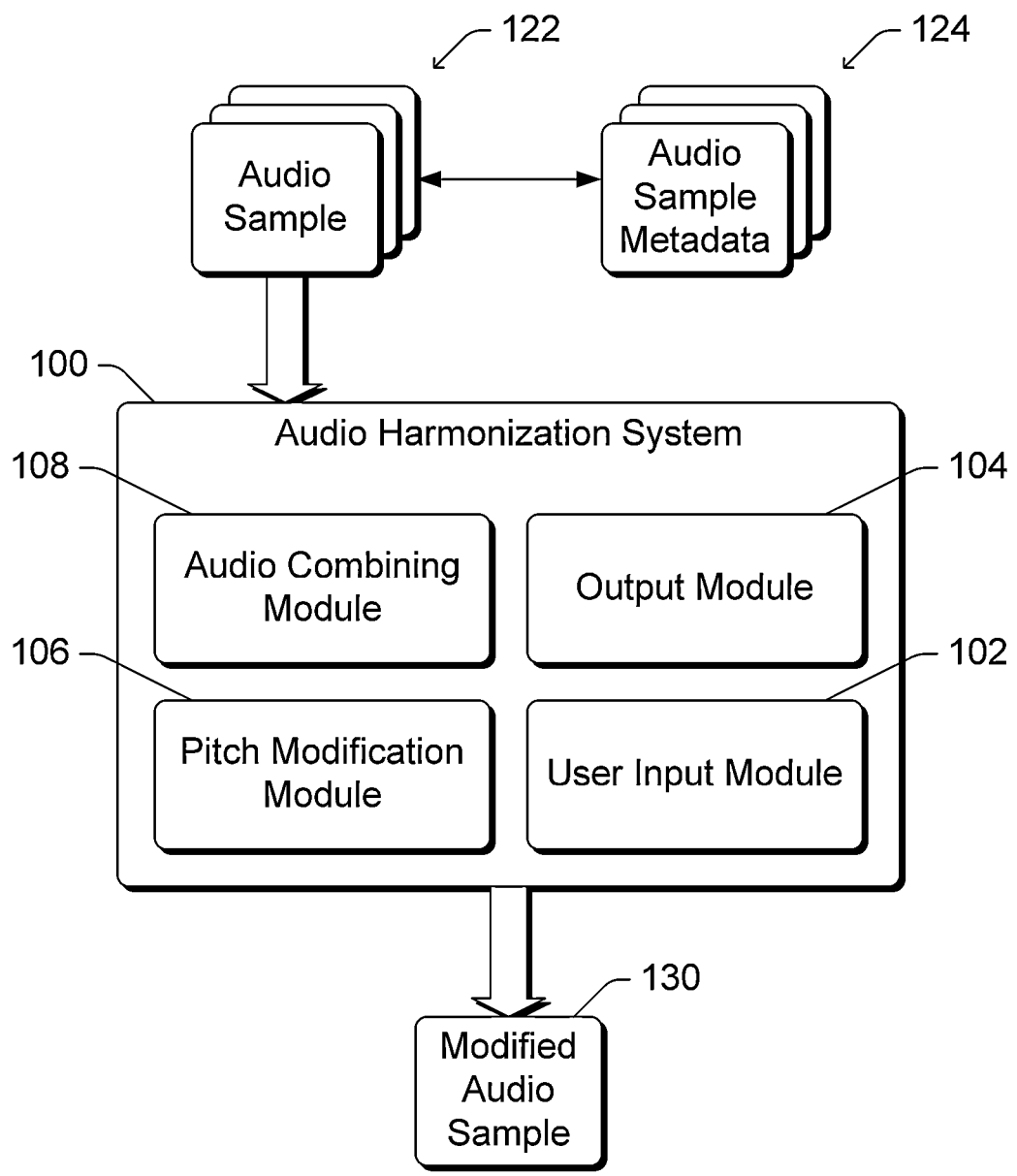
FIG. 1 is a block diagram illustrating an example audio harmonization system implementing the automatic audio harmonization based on pitch distributions in accordance with one or more embodiments.

FIG. 1 is a block diagram illustrating an example audio harmonization system 100 implementing the automatic audio harmonization based on pitch distributions in accordance with one or more embodiments. The audio harmonization system 100 can be implemented using a variety of different types of devices, such as a physical device or a virtual device. For example, the system 100 can be implemented using a physical device such as a desktop computer, a server computer, a laptop or notebook computer, a tablet or notepad computer, a mobile station, an entertainment appliance, a set-top box communicatively coupled to a display device, a television or other display device, a cellular or other wireless phone, a game console, an automotive computer, any other general purpose computing device, and so forth. The system 100 can also be implemented using a virtual device, such as a virtual machine running on a physical device. A virtual machine can be run on any of a variety of different types of physical devices (e.g., any of the various types listed above). Thus, the system 100 can be implemented using one or more of a variety of different devices ranging from full resource devices with substantial memory and processor resources (e.g., personal computers, game consoles) to low-resource devices with limited memory and/or processing resources (e.g., traditional set-top boxes, hand-held game consoles).

The audio harmonization system 100 includes a user input module 102, an output module 104, a pitch modification module 106, and an audio combining module 108. The audio harmonization system 100 obtains one or more audio samples 122. Each sample 122 includes audio data for one or more sounds. The audio samples 122 can include previously recorded samples, live samples (e.g., audio being presented at approximately the same time as (e.g., within a threshold amount of time of) the sample is being obtained by the audio harmonization system 100 or captured by another device or system, samples that are the result of previously combined samples (as discussed in more detail below), and so forth. The audio samples 122 can be obtained from a variety of different sources, such as from a local data store (e.g., implemented by the same device as implements the system 100), from a remote (e.g., accessed via a network) data store, from a microphone of the system 100, from another device or system capturing or otherwise receiving live samples, and so forth. When the audio data for the one or more sounds in a sample 122 is played back by a device, the device plays those one or more sounds.

Multiple samples 122 can optionally be grouped together into a set of samples. A set of samples can include the audio data for one or more of the multiple samples in the set, and/or an indication of (e.g., file name or other identifier of) the samples that are included in the set.

Each of the one or more sounds in a sample can have various characteristics (also referred to as parameters). Each audio sample 122 can have corresponding audio sample metadata 124 that identifies at least some of the parameters of the sample 122. Each set of samples can also have corresponding audio sample metadata 124 that identifies at least some of the parameters of the set of samples. The parameters of the set of samples refer to an aggregate of (e.g., a concatenation of, an average of, etc.) the metadata corresponding to each sample in the set. The sample metadata 124 corresponding to a sample 122 or set of samples can be stored in various manners, such as being stored as part of the same data structure or file as the corresponding sample 122 or set of samples, being stored in a separate database or other record, being stored in a remote cloud or server-based database, and so forth.

The user input module 102 receives user inputs from a user of the device implementing the system 100. User inputs can be provided in a variety of different manners, such as by pressing one or more keys of a keypad or keyboard of the device implementing the system 100, pressing one or more keys of a controller (e.g., remote control device, mouse, track pad, etc.) of the device implementing the system 100, pressing a particular portion of a touchpad or touchscreen of the device implementing the system 100, making a particular gesture on a touchpad or touchscreen of the device implementing the system 100, and/or making a particular gesture on a controller (e.g., remote control device, mouse, track pad, etc.) of the device implementing the system 100. User inputs can also be provided via other physical feedback input to the device implementing the system 100, such as tapping any portion of the device implementing the system 100, an action that can be recognized by a motion detection or other component of the device implementing the system 100 (such as shaking the device implementing the system 100, rotating the device implementing the system 100, bending or flexing the device implementing the system 100, etc.), and so forth. User inputs can also be provided in other manners, such as via voice or other audible inputs to a microphone, via motions of hands or other body parts observed by an image capture device, and so forth.

The output module 104 generates, manages, and/or outputs content for display, playback, and/or other presentation. This content can be created by the output module 104 or obtained from other modules of the system 100. This content can be, for example, a display or playback portion of a user interface (UI). The content can be displayed or otherwise played back by components of the device implementing the system 100 (e.g., speakers, interactive display devices, etc.). Alternatively, the output module 104 can generate one or more signals that are output to other devices or components (e.g., speakers, display devices, etc.) that are separate from the device implementing the system 100.

The pitch modification module 106 alters the pitch of one or more of the samples 122, resulting in a modified audio sample 130. The pitch of a sample 122 is altered by the module 106 to allow the sample 122 to sound better when played back with or combined with one or more other samples 122 (e.g., be more harmonically coherent with one or more other samples 122). How to alter the pitch of a sample 122 is determined based on the pitch distribution of the sample 122 as well as the pitch distribution of the one or more other samples 122 with which the sample 122 is being played back or combined, as discussed in more detail below.

The audio combining module 108 combines different samples 122, optionally creating a new sample 122 or set of samples. The combining of different samples 122 includes adjusting the pitch of one or more of the samples 122, as discussed in more detail below.

The audio harmonization system 100 can be used in a variety of different environments or scenarios. In one or more embodiments, system 100 generates modified audio sample 130 by altering the pitch of a sample 122 or set of samples 122. The modified audio sample 130 can be played back by the system 100, saved by the system 100, provided to another device or system, and so forth. For example, a user of the audio harmonization system 100 can be providing one sample 122 as a live sample (e.g., a user singing karaoke), and the system 100 can alter the pitch of the live sample to increase harmonization with another set of samples 122 (e.g., a previously recorded instrumental version of a song for which the user is singing the vocals).

Alternatively, system 100 can combine the modified audio sample 130 with another sample 122 or set of samples 122, resulting in a new combined set of audio samples. The new combined set of audio samples can be played back by the system 100, saved by the system 100, provided to another device or system, and so forth.

Although specific modules 102-108 are illustrated as being included in the audio harmonization system 100, it should be noted that the system 100 need not include all of the modules 102-108. For example, if system 100 alters the pitch of an audio sample 122 resulting in a modified audio sample, but does not combine the modified audio sample with another audio sample or set of audio samples, then the system 100 need not include audio combining module 108.

Each sample 122 has a corresponding harmonic content, which refers to the notes used in the sample. In one or more embodiments, the notes used in the sample refers to the notes that are included in the sample, regardless of the octave of the notes. The notes use in the sample may be, for example, D, E, F♯ (F sharp), and B. Alternatively, the notes used in the sample may include the note as well as the octave (above or below) of the note. The notes used may also be null, such as for a sample made up of an un-pitched drum roll. For a set of samples, the notes used in the set refers to the notes that are included in the samples in the set (e.g., each note that is included in at least one sample of the set but need not be included in each sample in the set).

The harmonic content of a sample 122 can be identified in the metadata 124 corresponding to the sample. Although the harmonic content of a sample 122 is discussed herein, the metadata 124 corresponding to a sample 122 can include various additional data describing one or more aspects, parameters, or characteristics of the sample 122.

The harmonic content of a sample 122 can be generated in a variety of different manners. In one or more embodiments, the harmonic content (as well as other metadata 124) of a sample 122 is generated automatically by analyzing the sample 122 using any of a variety of public and/or proprietary techniques. Alternatively, the harmonic content (as well as other metadata 124) of a sample 122 is generated manually, being assigned by one or more people (which may be, but need not be, a user of the audio harmonization system 100).

Pitch Modification

The pitch modification module 106 of FIG. 1 determines how to alter the pitch of a sample 122 to improve the harmonization of that sample 122 with one or more other samples 122. In one or more embodiments, this determination is made based on pitch distributions of the samples, and is used to automatically alter the pitch of one or more of the samples 122.

Figure 2:
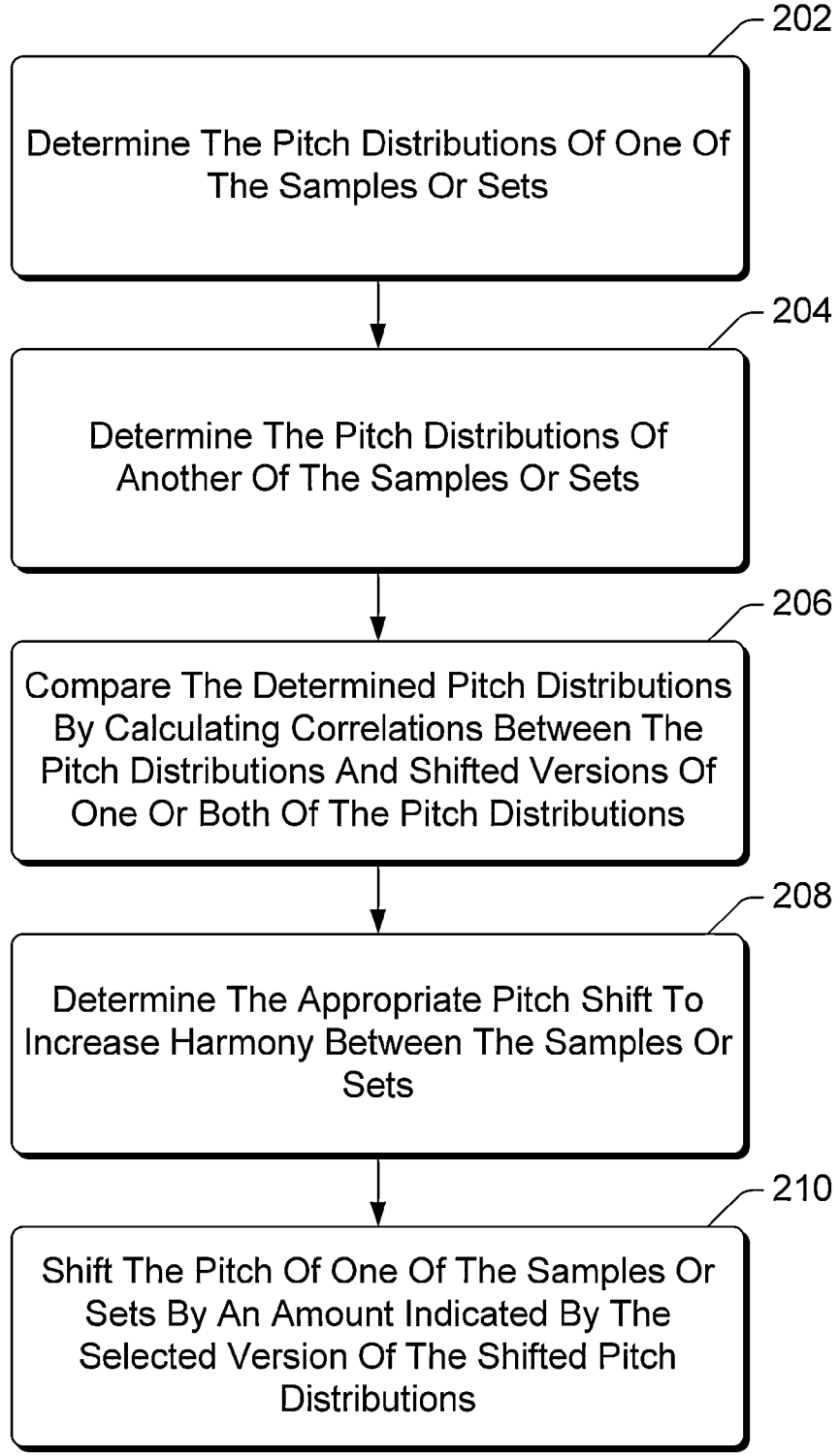
FIG. 2 is a flowchart illustrating an example process for automatically adjusting the pitch of one or more audio samples in accordance with one or more embodiments.

FIG. 2 is a flowchart illustrating an example process 200 for automatically adjusting the pitch of one or more samples in accordance with one or more embodiments. Process 200 is carried out by a pitch modification module, such as pitch modification module 106 of FIG. 1, and can be implemented in software, firmware, hardware, or combinations thereof. Process 200 is shown as a set of acts and is not limited to the order shown for performing the operations of the various acts. Process 200 is an example process for automatically adjusting the pitch of one or more samples; additional discussions of automatically adjusting the pitch of one or more samples are included herein with reference to different figures.

In process 200, the pitch distributions of one or more samples or sets of samples are determined (act 202). In one or more embodiments, the pitch distribution of a sample indicates how much of each pitch is present in the sample. The pitch distribution of a sample is determined by decomposing the sample into the set of frequencies in the sound waves generated by playing back the sample. Different pitches (also referred to as semitones or notes) are associated with different frequencies or frequency ranges, as is known to those skilled in the art. A sound can be one of twelve different possible pitches: A, A♯, B, C, C♯, D, D♯, E F, F♯, G, or G♯ (or enharmonic equivalents with flats). How much of each pitch is present in the sample is determined by how much of the sample when played back results in sound having a root frequency associated with the pitch (e.g., what percentage of the time of playback of the sample results in sound having a frequency associated with the pitch). This decomposition and determination of how much of each pitch is present in the sample can be performed using any of a variety of public and/or proprietary signal processing techniques. The pitch distribution can alternatively be represented in other manners, such as simply as the list of notes present (e.g., as detected by a human musician), and need not be dependent on computer or digital signal processing analysis. Despite the listing of percentages for each note in certain examples herein, the source of the pitch distribution data could be human entered metadata about each sample used. In situations in which the pitch distribution is the list of notes present, the pitch shifting and pitch correlations can be performed as discussed herein, although indications of absence or presence of a note (e.g., one value such as 0 for absence, and another value such as 1 for presence) can be used rather than percentages for each note.

In situations in which the pitch distributions for a set of samples are determined in act 202, the pitch distributions of the set of samples can be determined by determining the pitch distributions for each sample in the set of samples and then combining (e.g., averaging, adding and then normalizing to 1, etc.) the pitch distributions for each pitch in the set of samples. Alternatively, the pitch distributions for a set of samples can be determined in other manners. For example, the samples can be played back concurrently (or analyzed as if played back concurrently) and the pitch distributions for the set of samples determined as if the set of samples were a single sample.

The pitch distributions of another one or more samples or sets of samples are also determined (act 204). Thus, pitch distributions for two different samples (and/or sets of samples) are determined in acts 202 and 204. These two samples (and/or sets of samples) can be identified in different manners, such as being selected by a user, being determined automatically by the audio harmonization system 100, and so forth.

Figure 3:
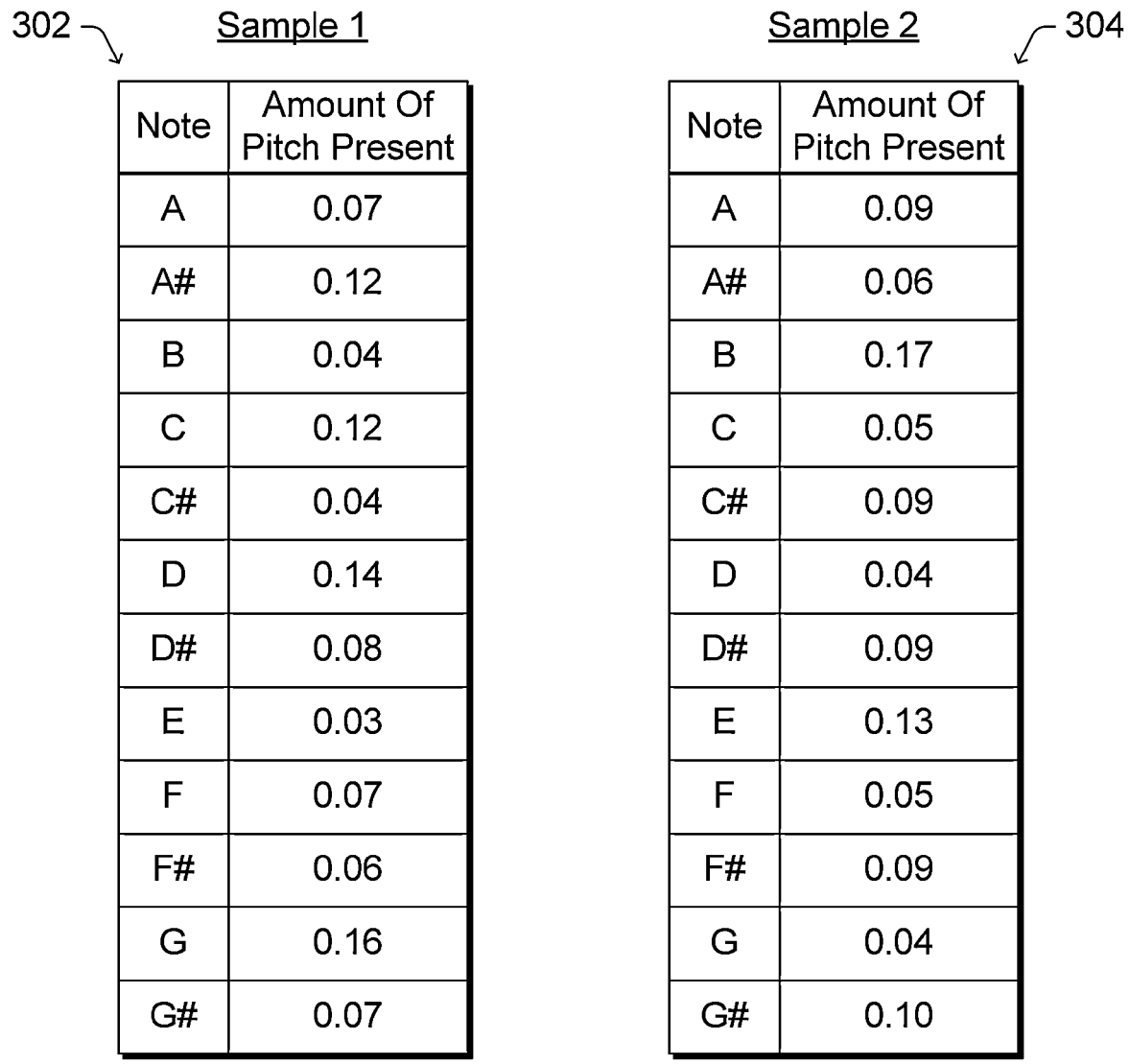
FIG. 3 illustrates example pitch distributions of two different example audio samples.

FIG. 3 illustrates example pitch distributions of two different example samples. A pitch distribution 302 for a Sample 1 is illustrated, indicating that 7% (e.g., shown as 0.07) of the sample is the pitch for the note A, 12% (e.g., shown as 0.12) of the sample is the pitch for the note A♯, 4% (e.g., shown as 0.04) of the sample is the pitch for the note B, and so forth. A pitch distribution 304 for a Sample 2 is also illustrated, indicating that 9% (e.g., shown as 0.09) of the sample is the pitch for the note A, 6% (e.g., shown as 0.06) of the sample is the pitch for the note A♯, 17% (e.g., shown as 0.17) of the sample is the pitch for the note B, and so forth. It should be noted that the pitch distribution for a sample identifies how much of each pitch is present in the sample without regard for which octave the particular note is in. For example, for Sample 1, 7% of the sample is the pitch for the note A, and that 7% can include pitches for the note A in one or more octaves.

Returning to FIG. 2, the pitch distributions determined in acts 202 and 204 are compared to one another by calculating the correlations between the determined pitch distributions and shifted versions of one or both of the determined pitch distributions (act 206). A shifted version of a pitch distribution refers to the values (e.g., the percentages) for the pitches being shifted up or down by one or more semitones. For example, the pitches can be shifted one semitone up, resulting in the percentage for the note A in the pitch distribution becoming what the percentage was for the note G♯ prior to the shifting, the percentage for the note A♯ in the pitch distribution becoming what the percentage was for the note A prior to the shifting, and so forth.

FIG. 4 illustrates example shifted versions of pitch distributions. A pitch distribution 402 is illustrated, with the pitches for Sample 2 of FIG. 3 being shifted one semitone up. A pitch distribution 404 is also illustrated, with the pitches for Sample 2 of FIG. 3 being shifted two semitones up.

Returning to FIG. 2, in act 206 the correlation between the pitch distributions determined in acts 202 and 204 as well as the shifted versions of the pitch distributions determined in acts 202 and 204 are calculated. The number of pitch shifts by one semitone that will yield a different pitch distribution is eleven, so the number of correlations calculated in act 206 is twelve—one for the original pitch distributions and one for each shifted pitch distribution. The values for the pitches in a pitch distribution can be viewed as a vector, and the correlation is the dot product of the pitch distribution vectors of the two samples. For example, the values for the pitches in the pitch distribution 302 of FIG. 3 can be viewed as a vector [0.07 0.12 0.04 0.12 0.04 0.14 0.08 0.03 0.07 0.06 0.16 0.07]. An alternative way to write this vector, as well as the example pitch distributions of FIG. 3, is using integer percentages, resulting in a vector of [7% 12% 4% 12% 4% 14% 8% 3% 7% 6% 16% 7%]. The pitch correlation is determined according to the following formula:

$$P(S1, S2) = D(S1) * D(S2) = \sum_{i=0}^{11} d_i * d_i' \quad (1)$$

where P(S1, S2) refers to the pitch correlation between the two samples, D(S1) is the pitch distribution of one of the two samples, D(S2) is the pitch distribution of the other of the two samples, $d_i$ is the value for the pitch i in the pitch distribution of one of the two samples, and $d'_i$ is the value for the pitch i in the pitch distribution of the other of the two samples.

The pitch correlation is calculated using formula (1) for the pitch distributions determined in acts 202 and 204 as well as for each of the shifted versions of the pitch distributions determined in acts 202 and 204. FIG. 5 illustrates an example table 502 of pitch shift correlations for Sample 1 and Sample 2 of FIG. 3. Table 502 illustrates that the pitch shift correlation for the pitch distributions for Sample 1 and Sample 2 without shifting is 0.0689, that the pitch shift correlation for the pitch distributions for Sample 1 unshifted and Sample 2 shifted one semitone up is 0.0904, and so forth.

Returning to FIG. 2, the appropriate pitch shift to increase harmony between the samples or sets determined in acts 202 and 204 is determined (act 208). In one or more embodiments, the appropriate pitch shift is the pitch shift that results in approximately the highest (e.g., the largest or within a threshold amount of the highest) pitch correlation. For example, referring to table 502 of FIG. 5, the appropriate pitch shift would be +11 semitones (having a pitch correlation of 0.0945). It should be noted that situations can arise in which the highest pitch correlation result from the samples without shifting, so the appropriate pitch shift determined in act 208 may be zero (no shift).

The determination of the appropriate pitch shift in act 208 optionally takes into consideration how much pitch modification is performed in order to obtain the appropriate shift. Preference is given to shifting the pitch by a smaller number of semitones. In one or more embodiments, the pitch correlations are weighted to generate weighted pitch correlations, with larger weights being used for selected pitch correlations obtained with less pitch modification and smaller weights being used for selected pitch correlations obtained with more pitch modification.

FIG. 6 illustrates an example table 602 of pitch shifts and corresponding weights in accordance with one or more embodiments. As illustrated in table 602, a pitch shift of 0 corresponds to a weight of 1.0, a pitch shift of 3 corresponds to a weight of 0.98, a pitch shift of 5 corresponds to a weight of 0.97, and so forth. Each pitch correlation is multiplied by the weight corresponding to the amount of shift (e.g., the number of semitones) the pitch was shifted to obtain the weighted pitch correlation. For example, the pitch correlation resulting from the pitch being shifted +3 semitones is multiplied by 0.98 to obtain the weighted pitch correlation. The appropriate pitch shift in act 208 of FIG. 2 is then the pitch shift that results in approximately the highest (e.g., the largest or within a threshold amount of the highest) weighted pitch correlation.

Returning to FIG. 2, the pitch of one of the samples or sets of samples is shifted by an amount indicated by the determined appropriate pitch shift as determined in act 208 (act 210). The sample or set of samples the pitch of which is shifted can be, but need not be, the sample or set of samples that was shifted in act 206 when comparing the determined pitch distributions. In one or more embodiments, one of the samples or sets of samples is shifted by the amount identified by the determined appropriate pitch shift as determined in act 208 (e.g., by +11 semitones using the example of table 502 of FIG. 5).

It should be noted that because the pitch distributions do not account for octaves of sounds, a negative shift rather than a positive shift may be performed. FIG. 7 illustrates an example table 702 of pitch shift combinations, showing the relative positive and negative shift combinations. Positive pitch shifts are illustrated on the left side of table 702 and the equivalent negative pitch shifts are illustrated on the right side of table 702. Thus, as illustrated in table 702, a pitch shift of +1 is equivalent to a pitch shift of −11, a pitch shift of +3 is equivalent to a pitch shift of −9, and so forth.

Returning to FIG. 2, in one or more embodiments the amount of shift in act 210 is the one of the positive pitch shift and the equivalent negative pitch shift having the smaller absolute value. By selecting the one of the positive and negative pitch shift having the smaller absolute value, the amount of shifting performed may be reduced, resulting in a shifted version of the sample that sounds closer to the original (unshifted) version of the sample. For example, if the appropriate pitch shift as determined in act 208 were to be +11, then in act 210 the amount of shift would be −1 (which is equivalent to +11 per table 702, and has a smaller absolute value). By way of another example, if the appropriate pitch shift as determined in act 208 were to be +5, then in act 201 the amount of shift would be +5 (which has a smaller absolute value than the equivalent of −7 per table 702).

The pitch of one of the samples or sets of samples can be shifted in act 210 without changing rhythm in any of a variety of different manners using any of a variety of public and/or proprietary techniques. The shifting of the pitch of a sample refers to, for example, shifting approximately all of the notes or sounds (e.g., a threshold number of notes or sounds) in the sample by approximately the same amount (e.g., by the same number of semitones or within a threshold number of semitones). The shifting of the pitch of a set of samples refers to shifting approximately all of the notes or sounds (e.g., a threshold number of notes or sounds) in the samples in the set by approximately the same amount (e.g., by the same number of semitones or within a threshold number of semitones).

It should be noted that although process 200 is discussed with respect to the pitch of one of the samples or sets of samples determined in act 202 or act 204 being shifted, alternatively both the pitches of the sample or set of samples determined in act 202 as well as the sample or set of samples determined in act 204 can be shifted. For example, if it is determined in act 208 that the pitch of Sample 2 is to be shifted by +5, then the pitch of Sample 2 could be shifted by +3 and the pitch of Sample 1 shifted by −2. By way of another example, if it is determined in act 208 that the pitch of Sample 2 is to be shifted by +5, then the pitch of Sample 2 could be shifted by +3 and the pitch of Sample 1 shifted by −2.

In the discussions above, reference is made to pitch distributions being determined based on how much of each pitch is present in the sample without regard for which octave the particular note is in. Alternatively, the pitch distribution can be determined based on how much of each pitch, for each of multiple notes and multiple octaves, is present in the sample. For example, the determination could be made of how much of the sample is the pitch for the note A in the first octave (A1), how much of the sample is the pitch for the note A in the second octave (A2), how much of the sample is the pitch for the note A in the third octave (A3), and so forth for each note in each octave (or at least in multiple octaves). The correlations between the determined pitch distributions and shifted versions of the determined are determined as discussed above, although there are a larger number of pitch shifts that will yield a different pitch distribution (e.g., an additional twelve pitch shifts for each additional octave). The appropriate pitch shift to increase harmony between the samples or sets is also determined and the pitch of one of the samples or sets of samples is shifted by an amount indicated by the determined pitch shift as discussed above, although different relative positive and negative shift combinations are used based on the number of octaves being used to determine the pitch distribution.

It should be noted that the pitch modification discussed herein uses the pitch distributions of the samples to understand the harmonic composition of the samples. Thus, the pitch modification need not rely on the musical key and/or chord progression in the samples.

Audio Combining

The audio combining module 108 of FIG. 1 combines different samples or sets of samples, optionally creating a new sample or set of samples. References herein to samples or sets of samples being combined include situations in which a sample is combined with another sample, situations in which a sample is combined with a set of samples, and situations in which a set of samples is combined with another set of samples. The result of combining samples and/or sets can be a new sample or a new set of samples, or the previous sample or set can be replaced by the combined sample or set.

Figure 8:
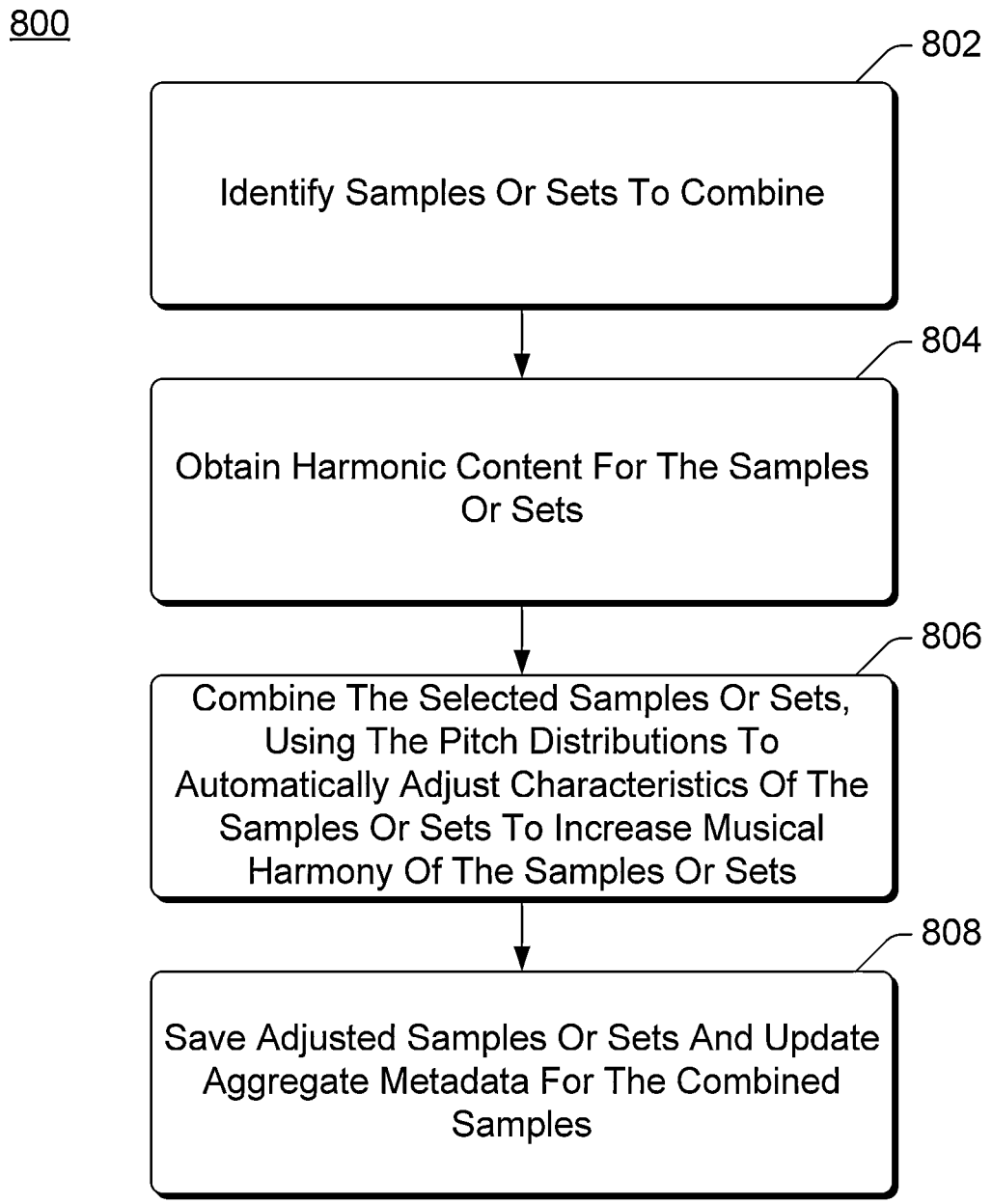
FIG. 8 is a flowchart illustrating an example process for combining audio samples in accordance with one or more embodiments.

FIG. 8 is a flowchart illustrating an example process 800 for combining audio samples in accordance with one or more embodiments. Process 800 is carried out by an audio combining module, such as audio combining module 108 of FIG. 1, and can be implemented in software, firmware, hardware, or combinations thereof. Process 800 is shown as a set of acts and is not limited to the order shown for performing the operations of the various acts. Process 800 is an example process for combining audio samples; additional discussions of combining audio samples are included herein with reference to different figures.

In process 800, samples and/or sets to combine are identified (act 802). The samples or sets can be identified by user selection, which can be received via any of a variety of different user inputs as discussed above. For example, the user selection of a sample or set can be selection of a sample or set from a menu, selection of an icon or other graphical representation of a sample or set, and so forth. Alternatively, one or more of the samples and/or sets can be identified automatically. For example, the user may request to sing a song and have his or her singing combined with an instrumental version of the song, in which case the user's singing is automatically identified as one of the samples in act 802.

Harmonic content for the samples or sets is obtained (act 804). The harmonic content refers to the notes used in the sample or sets as discussed above. The harmonic content can be obtained in various manners, such as by retrieving previously generated harmonic content (e.g., stored as metadata associated with the sample or set), generating the harmonic content in response to selection of a sample or set, generating the harmonic content as the sample is received (e.g., as the audio data of a live sample is received), and so forth.

The samples or sets identified in act 802 are combined using the pitch distributions of the samples or sets to automatically adjust characteristics of at least one of the samples to increase musical compatibility of the samples (act 806). Various different characteristics of at least one of the samples or sets can be adjusted, including the pitch of a sample or set. Thus, in act 806 the pitch of a sample or set is automatically altered so that the samples or sets identified in act 802 sound harmonically coherent. The samples or sets are combined in response to a user request to combine the samples or sets, which can be received via any of a variety of user inputs as discussed above. For example, a user-selectable "combine" button, icon, menu item, etc. can be displayed and selected by the user to request that the selected samples or sets be combined. By way of another example, selection of the samples or sets can be a user request to combine the samples or sets. Any expression of user intent to combine the samples or sets can be used with the techniques discussed herein.

The adjusted samples or sets and the aggregate metadata corresponding to the combined samples or sets are also saved (act 808). The adjusted sample or set can be saved as a new sample or set (e.g., a new sample 122), or alternatively the adjusted sample or set can overwrite and replace the previous version of the sample. If two samples are combined, then a new set of samples can be created that includes both of the samples (one or more of which may have been adjusted as discussed above). If a sample is combined with a set of samples, then the sample (which may have been adjusted as discussed above) is added to the set of samples or alternatively a new set of samples that includes the set of samples and the sample with which the set is being combined may be generated. The metadata corresponding to the sample and/or set of samples is updated as appropriate to reflect the adjustment of the sample and/or the addition of the sample to the set of samples.

Alternatively, the adjusted samples and/or the aggregate metadata need not be saved. For example, the combined samples can be played back (e.g., as a live performance) without being saved.

Example System

Although particular functionality is discussed herein with reference to particular modules, it should be noted that the functionality of individual modules discussed herein can be separated into multiple modules, and/or at least some functionality of multiple modules can be combined into a single module. Additionally, a particular module discussed herein as performing an action includes that particular module itself performing the action, or alternatively that particular module invoking or otherwise accessing another component or module that performs the action (or performs the action in conjunction with that particular module). Thus, a particular module performing an action includes that particular module itself performing the action and/or another module invoked or otherwise accessed by that particular module performing the action.

Figure 9:
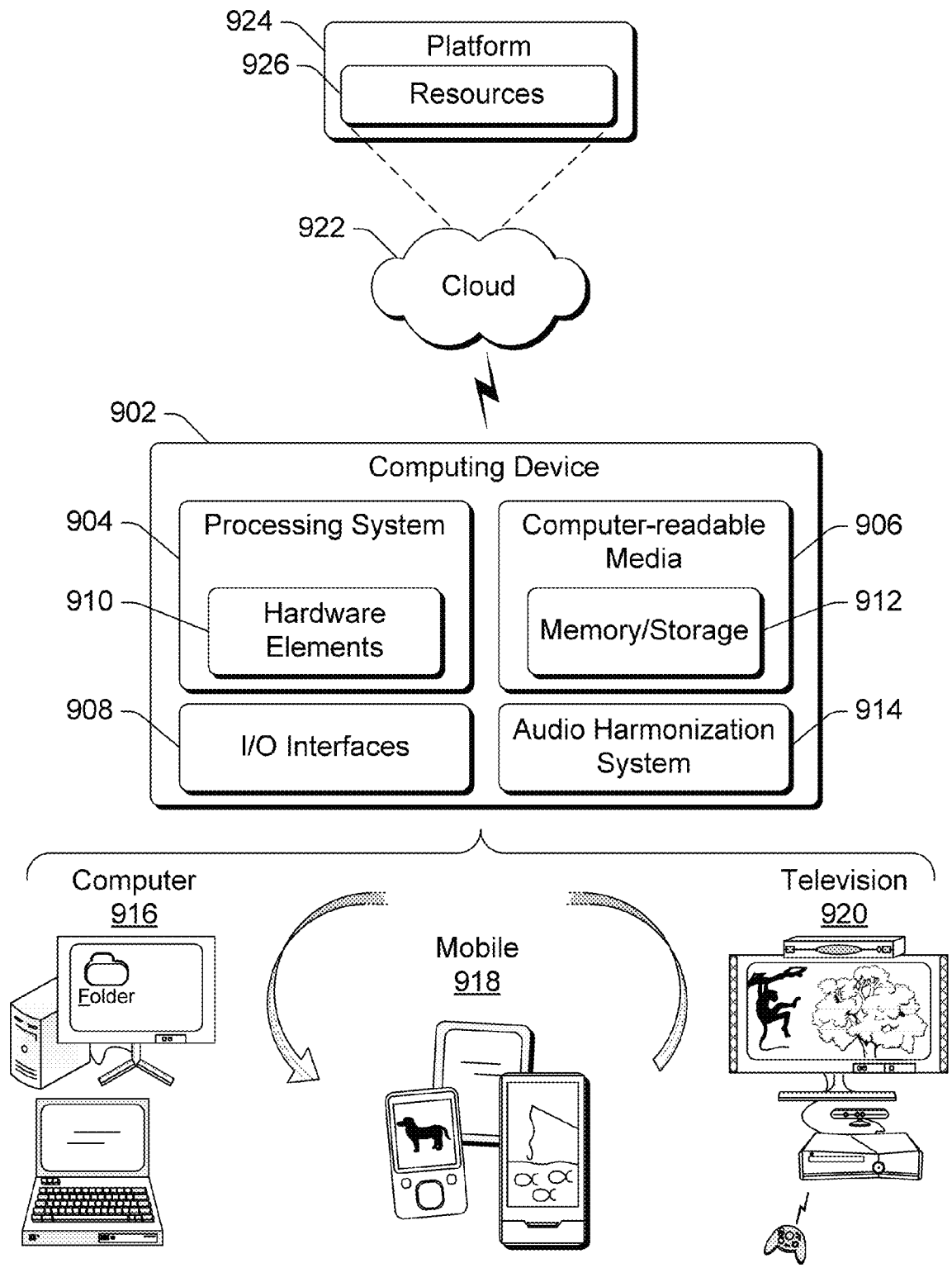
FIG. 9 illustrates an example system that includes an example computing device that is representative of one or more systems and/or devices that may implement the various techniques described herein.

FIG. 9 illustrates an example system generally at 900 that includes an example computing device 902 that is representative of one or more systems and/or devices that may implement the various techniques described herein. The computing device 902 may be, for example, a server of a service provider, a device associated with a client (e.g., a client device), an on-chip system, and/or any other suitable computing device or computing system.

The example computing device 902 as illustrated includes a processing system 904, one or more computer-readable media 906, and one or more I/O Interfaces 908 that are communicatively coupled, one to another. Although not shown, the computing device 902 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 904 is representative of functionality to perform one or more operations using hardware. Accordingly, the processing system 904 is illustrated as including hardware elements 910 that may be configured as processors, functional blocks, and so forth. This may include implementation in hardware as an application specific integrated circuit or other logic device formed using one or more semiconductors. The hardware elements 910 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable media 906 is illustrated as including memory/storage 912. The memory/storage 912 represents memory/storage capacity associated with one or more computer-readable media. The memory/storage 912 may include volatile media (such as random access memory (RAM)) and/or nonvolatile media (such as read only memory (ROM), Flash memory, optical disks, magnetic disks, and so forth). The memory/storage 912 may include fixed media (e.g., RAM, ROM, a fixed hard drive, and so on) as well as removable media (e.g., Flash memory, a removable hard drive, an optical disc, and so forth). The computer-readable media 906 may be configured in a variety of other ways as further described below.

Input/output interface(s) 908 are representative of functionality to allow a user to enter commands and information to computing device 902, and also allow information to be presented to the user and/or other components or devices using various input/output devices. Examples of input devices include a keyboard, a cursor control device (e.g., a mouse), a microphone (e.g., for voice inputs), a scanner, touch functionality (e.g., capacitive or other sensors that are configured to detect physical touch), a camera (e.g., which may employ visible or non-visible wavelengths such as infrared frequencies to detect movement that does not involve touch as gestures), and so forth. Examples of output devices include a display device (e.g., a monitor or projector), speakers, a printer, a network card, tactile-response device, and so forth. Thus, the computing device 902 may be configured in a variety of ways as further described below to support user interaction.

Computing device 902 also includes an audio harmonization system 914. Audio harmonization system 914 provides various functionality for automatically harmonizing audio based on pitch distributions as discussed above. Audio harmonization system 914 can implement, for example, audio harmonization system 100 of FIG. 1.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of computing platforms having a variety of processors.

An implementation of the described modules and techniques may be stored on or transmitted across some form of computer-readable media. The computer-readable media may include a variety of media that may be accessed by the computing device 902. By way of example, and not limitation, computer-readable media may include "computer-readable storage media" and "computer-readable signal media."

"Computer-readable storage media" refers to media and/or devices that enable persistent storage of information and/or storage that is tangible, in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" refers to a signal-bearing medium that is configured to transmit instructions to the hardware of the computing device 902, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 910 and computer-readable media 906 are representative of instructions, modules, programmable device logic and/or fixed device logic implemented in a hardware form that may be employed in some embodiments to implement at least some aspects of the techniques described herein. Hardware elements may include components of an integrated circuit or on-chip system, an application-specific integrated circuit (ASIC), a field-programmable gate array (FPGA), a complex programmable logic device (CPLD), and other implementations in silicon or other hardware devices. In this context, a hardware element may operate as a processing device that performs program tasks defined by instructions, modules, and/or logic embodied by the hardware element as well as a hardware device utilized to store instructions for execution, e.g., the computer-readable storage media described previously.

Combinations of the foregoing may also be employed to implement various techniques and modules described herein. Accordingly, software, hardware, or program modules and other program modules may be implemented as one or more instructions and/or logic embodied on some form of computer-readable storage media and/or by one or more hardware elements 910. The computing device 902 may be configured to implement particular instructions and/or functions corresponding to the software and/or hardware modules. Accordingly, implementation of modules as a module that is executable by the computing device 902 as software may be achieved at least partially in hardware, e.g., through use of computer-readable storage media and/or hardware elements 910 of the processing system. The instructions and/or functions may be executable/operable by one or more articles of manufacture (for example, one or more computing devices 902 and/or processing systems 904) to implement techniques, modules, and examples described herein.

As further illustrated in FIG. 9, the example system 900 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 900, multiple devices are interconnected through a central computing device. The central computing device may be local to the multiple devices or may be located remotely from the multiple devices. In one or more embodiments, the central computing device may be a cloud of one or more server computers that are connected to the multiple devices through a network, the Internet, or other data communication link.

In one or more embodiments, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one or more embodiments, a class of target devices is created and experiences are tailored to the generic class of devices. A class of devices may be defined by physical features, types of usage, or other common characteristics of the devices.

In various implementations, the computing device 902 may assume a variety of different configurations, such as for computer 916, mobile 918, and television 920 uses. Each of these configurations includes devices that may have generally different constructs and capabilities, and thus the computing device 902 may be configured according to one or more of the different device classes. For instance, the computing device 902 may be implemented as the computer 916 class of a device that includes a personal computer, desktop computer, a multi-screen computer, laptop computer, notebook, and so on.

The computing device 902 may also be implemented as the mobile 918 class of device that includes mobile devices, such as a mobile phone, portable music player, portable gaming device, a tablet computer, a multi-screen computer, and so on. The computing device 902 may also be implemented as the television 920 class of device that includes devices having or connected to generally larger screens in casual viewing environments. These devices include televisions, set-top boxes, gaming consoles, and so on.

The techniques described herein may be supported by these various configurations of the computing device 902 and are not limited to the specific examples of the techniques described herein. This functionality may also be implemented all or in part through use of a distributed system, such as over a "cloud" 922 via a platform 924 as described below.

The cloud 922 includes and/or is representative of a platform 924 for resources 926. The platform 924 abstracts underlying functionality of hardware (e.g., servers) and software resources of the cloud 922. The resources 926 may include applications and/or data that can be utilized while computer processing is executed on servers that are remote from the computing device 902. Resources 926 can also include services provided over the Internet and/or through a subscriber network, such as a cellular or Wi-Fi network.

The platform 924 may abstract resources and functions to connect the computing device 902 with other computing devices. The platform 924 may also serve to abstract scaling of resources to provide a corresponding level of scale to encountered demand for the resources 926 that are implemented via the platform 924. Accordingly, in an interconnected device embodiment, implementation of functionality described herein may be distributed throughout the system 900. For example, the functionality may be implemented in part on the computing device 902 as well as via the platform 924 that abstracts the functionality of the cloud 922.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
   obtaining a first pitch distribution of first audio, the first audio comprising an audio sample or set of audio samples;
   obtaining a second pitch distribution of second audio, the second audio comprising an audio sample or set of audio samples;
   determining, based on the first pitch distribution and the second pitch distribution, a pitch shift to increase harmonic coherence of the first audio and the second audio; and
   using, by a device, the pitch shift to increase harmonic coherence of the first audio and the second audio.

2. A method as recited in claim 1, the using comprising automatically modifying the first audio sample or set of audio samples by shifting the first audio sample or set of audio samples by an amount indicated by the pitch shift.

3. A method as recited in claim 2, the amount indicated by the pitch shift comprising a negative pitch shift equivalent to the pitch shift.

4. A method as recited in claim 1, the first pitch distribution identifying how much of each of multiple pitches of notes is present in the first audio sample or set of audio samples regardless of which octave each of the notes is in, and the second pitch distribution identifying how much of each of the multiple pitches of the notes is present in the second audio sample or set of audio samples regardless of which octave each of the notes is in.

5. A method as recited in claim 1, the first pitch distribution identifying how much of each of multiple pitches, for each of multiple notes in multiple octaves, is present in the first audio sample or set of audio samples, and the second pitch distribution identifying how much of each of the multiple pitches, for each of the multiple notes in the multiple octaves, is present in the second audio sample or set of audio samples.

6. A method as recited in claim 1, the determining comprising:
   generating a first vector representing the first pitch distribution;
   generating a second vector representing the second pitch distribution; and
   generating a pitch correlation for the first pitch distribution and the second pitch distribution that is a summation of the dot product of the first vector and the second vector.

7. A method as recited in claim 6, the determining further comprising:
   shifting the first pitch distribution by a particular amount resulting in an additional vector representing the shifted first pitch distribution; and
   generating a pitch correlation for the shifted pitch distribution and the second pitch distribution that is a summation of the dot product of the additional vector and the second vector.

8. A method as recited in claim 7, the determining further comprising:
   repeating the shifting the first pitch distribution and the generating a pitch correlation for the shifted pitch distribution and the second pitch distribution for multiple additional shiftings of the first pitch distribution, resulting in multiple pitch correlations.

9. A method as recited in claim 8, the multiple additional shiftings comprising ten additional shiftings of the first pitch distribution, resulting in twelve generated pitch correlations.

10. A method as recited in claim 8, the determining further comprising selecting, as the pitch shift to increase harmonic coherence of the first audio and the second audio, the shifted pitch distribution resulting in a highest pitch correlation.

11. A method as recited in claim 8, the determining further comprising weighting, for each of the multiple pitch correlations, the pitch correlation based on the amount of shifting of the first pitch distribution from which the pitch correlation was generated.

12. A computing device comprising:
one or more processors; and
computer-readable storage medium having stored thereon multiple instructions that, responsive to execution by the one or more processors, cause the one or more processors to perform acts comprising:
determining, based on pitch distributions of first audio and second audio, an amount to shift pitch of one or both of the first audio and the second audio to increase harmonic coherence of the first audio and the second audio, and
using the determined amount to increase harmonic coherence of the first audio and the second audio by shifting one or both of the first audio and the second audio based on the amount.

13. A computing device as recited in claim 12, the first audio comprising an audio sample or set of audio samples, the second audio comprising an audio sample or set of audio samples, the pitch distribution of the first audio identifying how much of each of multiple pitches of notes is present in the first audio sample or set of audio samples regardless of which octave each of the notes is in, and the pitch distribution of the second audio identifying how much of each of the multiple pitches of the notes is present in the second audio sample or set of audio samples regardless of which octave each of the notes is in.

14. A computing device as recited in claim 12,
the first audio comprising an audio sample or set of audio samples,
the second audio comprising an audio sample or set of audio samples,
the pitch distribution of the first audio identifying how much of each of multiple pitches, for each of multiple notes in multiple octaves, is present in the first audio sample or set of audio samples, and
the pitch distribution of the second audio identifying how much of each of the multiple pitches, for each of the multiple notes in the multiple octaves, is present in the second audio sample or set of audio samples.

15. A computing device as recited in claim 12, the using comprising:
identifying, based on multiple shiftings of pitch of the first audio, a pitch shift to increase harmonic coherence of the first audio and the second audio;
identifying a negative pitch shift equivalent to the pitch shift; and
shifting the first audio by the negative pitch shift in response to the absolute value of the negative pitch shift being greater than the pitch shift, and shifting the first audio by the pitch shift in response to the absolute value of the negative pitch shift being less than the pitch shift.

16. A computing device as recited in claim 12, the using comprising:
generating a first vector representing the pitch distribution of the first audio;
generating a second vector representing the pitch distribution of the second audio; and
generating a pitch correlation for the pitch distribution of the first audio and the pitch distribution of the second audio that is a summation of the dot product of the first vector and the second vector.

17. A computing device as recited in claim 16, the using further comprising:
shifting the pitch distribution of the first audio by a particular amount resulting in an additional vector representing the shifted pitch distribution; and
generating a pitch correlation for the shifted pitch distribution and the pitch distribution of the second audio that is a summation of the dot product of the additional vector and the second vector.

18. A computing device as recited in claim 17, the using further comprising:
repeating the shifting the pitch distribution of the first audio and the generating a pitch correlation for the shifted pitch distribution and the pitch distribution of the second audio for multiple additional shiftings of the pitch distribution of the first audio, resulting in multiple pitch correlations.

19. A computing device as recited in claim 18, the using further comprising selecting, as the amount to shift pitch of the first audio to increase harmonic coherence of the first audio and the second audio, the shifted pitch distribution resulting in a highest pitch correlation.

20. A computing device comprising:
one or more processors; and
an audio harmonization system stored in a computer-readable storage medium of the computing device and configured to, responsive to execution by the one or more processors:
obtain a first pitch distribution of first audio, the first audio comprising an audio sample or set of audio samples,
obtain a second pitch distribution of second audio, the second audio comprising an audio sample or set of audio samples,
determine, based on the first pitch distribution and the second pitch distribution, a pitch shift to increase harmonic coherence of the first audio and the second audio, and
shift, using the pitch shift, one or both of a pitch of the first audio and a pitch of the second audio to increase harmonic coherence of the first audio and the second audio.

* * * * *